(12) United States Patent
Matsuzaki et al.

(10) Patent No.: US 11,437,298 B2
(45) Date of Patent: Sep. 6, 2022

(54) ELECTRONIC MODULE AND METHOD FOR MANUFACTURING ELECTRONIC MODULE

(71) Applicant: SHINDENGEN ELECTRIC MANUFACTURING CO., LTD., Tokyo (JP)

(72) Inventors: Osamu Matsuzaki, Hanno (JP); Kosuke Ikeda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/477,485

(22) PCT Filed: Sep. 14, 2017

(86) PCT No.: PCT/JP2017/033267
§ 371 (c)(1),
(2) Date: Jul. 11, 2019

(87) PCT Pub. No.: WO2019/053840
PCT Pub. Date: Mar. 21, 2019

(65) Prior Publication Data
US 2019/0371703 A1    Dec. 5, 2019

(51) Int. Cl.
*H01L 21/56* (2006.01)
*H01L 23/433* (2006.01)
(Continued)

(52) U.S. Cl.
CPC .......... *H01L 23/4334* (2013.01); *H01L 21/56* (2013.01); *H01L 23/3121* (2013.01); *H01L 23/5389* (2013.01); *H01L 23/3735* (2013.01)

(58) Field of Classification Search
CPC ... H01L 23/4334; H01L 23/31; H01L 23/538; H01L 23/49827
See application file for complete search history.

(56) References Cited

U.S. PATENT DOCUMENTS 5,497,258 A * 3/1996 Ju .................. G02F 1/13452
                                                    349/149
7,681,309 B2 * 3/2010 Miller ............ H01L 23/49811
                                                    29/830
(Continued)

FOREIGN PATENT DOCUMENTS

EP    1962342 A1    8/2008
EP    2814059 A1    12/2014
(Continued)

OTHER PUBLICATIONS

Office Action from TW app. No. 107132309, dated Oct. 5, 2019, with English translation from Google Translate.
(Continued)

*Primary Examiner* — Marcos D. Pizarro
*Assistant Examiner* — Quinton A Brasfield
(74) *Attorney, Agent, or Firm* — Ladas & Parry, LLP

(57) ABSTRACT

An electronic module has a first substrate 11, an electronic element 13, 23 disposed on one side of the first substrate 11, a second substrate 21 disposed on one side of the electronic element 13, 23, a first coupling body 210 disposed between the first substrate 11 and the second substrate 21, a second coupling body 220 disposed between the first substrate 11 and the second substrate 21, and shorter than the first coupling body 210, and a sealing part 90 which seals at least the electronic element. The first coupling body 210 is not electrically connected to the electronic element. The second coupling body 220 is electrically connected to the electronic element 13, 23.

5 Claims, 12 Drawing Sheets

(51) Int. Cl.
*H01L 23/31* (2006.01)
*H01L 23/538* (2006.01)
*H01L 23/373* (2006.01)

(56) References Cited

U.S. PATENT DOCUMENTS

| | | | | |
|---|---|---|---|---|
| 2001/0053068 | A1* | 12/2001 | Murayama | H05K 1/144 361/760 |
| 2007/0267218 | A1* | 11/2007 | Kimura | H01L 21/486 257/E23.178 |
| 2009/0190319 | A1* | 7/2009 | Hatakeyama | H05K 3/368 361/803 |
| 2011/0291261 | A1* | 12/2011 | Fleischman | H01L 24/06 257/737 |
| 2012/0168206 | A1* | 7/2012 | Sekine | H01L 23/49827 174/266 |
| 2013/0341786 | A1 | 12/2013 | Hsu et al. | |
| 2014/0197525 | A1 | 7/2014 | Kadoguchi et al. | |
| 2015/0008021 | A1 | 1/2015 | Ishida et al. | |
| 2016/0181175 | A1* | 6/2016 | Ikeda | H01L 23/051 257/687 |
| 2016/0260689 | A1 | 9/2016 | Meyer et al. | |
| 2018/0047649 | A1* | 2/2018 | Bando | H01L 24/73 |
| 2020/0013764 | A1* | 1/2020 | Kim | H01L 23/49816 |

FOREIGN PATENT DOCUMENTS

| | | | |
|---|---|---|---|
| EP | 3208838 A1 | 8/2017 | |
| JP | 2001267714 A | 9/2001 | |
| JP | 2009176947 A * | 8/2009 | ............ B81B 7/007 |
| JP | 2009176947 A | 8/2009 | |
| JP | 2014045157 A | 3/2014 | |
| JP | 2015015302 A | 1/2015 | |
| JP | 2016048728 A | 4/2016 | |
| JP | 2016529716 A | 9/2016 | |
| TW | 201401482 A * | 6/2012 | |
| TW | 201401482 A | 1/2014 | |
| WO | 2016024333 A1 | 2/2016 | |

OTHER PUBLICATIONS

International Search Report for PCT/JP2017/033267, dated Dec. 19, 2017, and its English translation provided by WIPO.
Written Opinion for PCT/JP2017/033267, dated Dec. 19, 2017, and its English translation provided by Google Translate.
International Preliminary Examination Report (Chapter II) for PCT/JP2017/033267, dated Sep. 20, 2018, and its English translation provided by Google Translate.
Netherlands, Application No. 2021620, Search Report and opinion, dated May 16, 2019.

* cited by examiner

ELECTRONIC MODULE AND METHOD FOR MANUFACTURING ELECTRONIC MODULE

CROSS-REFERENCE TO RELATED APPLICATION

The present application is the U.S. national phase of PCT Application PCT/JP2017/033267 filed on Sep. 14, 2017, the disclosure of which is incorporated herein by reference in its entirety.

TECHNICAL FIELD

The present invention relates to an electronic module having a first substrate and a second substrate, and an electronic element which is disposed between the first substrate and the second substrate, and a method for manufacturing the electronic module.

BACKGROUND ART

There has been conventionally known an electronic module including a plurality of electronic elements disposed inside a sealing resin (e.g., refer to JP 2014-45157 A). Downsizing of such an electronic module is desired.

When the number of electronic elements included in the electronic module increases, the size of a first substrate and a second substrate which is disposed facing the first substrate in the plane direction increases in the electronic module. When the size of the first substrate and the second substrate increases in this manner, the first substrate and the second substrate may be warped or distorted in a heat treatment process such as a soldering process or a reflow process.

Further, when the electronic module is sealed with a sealing resin or the like, the first substrate and the second substrate are pressed by a metal mold. Since there are tolerances in a member including the first substrate and the second substrate, the thickness of assembled components of the electronic module in the thickness direction may become larger than the thickness of the metal mold in the thickness direction. When a strong pressing force is applied from the metal mold in such a case, there is a possibility of the occurrence of an electric trouble.

SUMMARY OF INVENTION

Technical Problem

The present invention provides an electronic module capable of preventing warpage or distortion of a first substrate and a second substrate and also reducing the possibility of the occurrence of an electric trouble, and a method for manufacturing the electronic module.

Solution to Problem

An electronic module according to the present invention may comprise:
 a first substrate;
 an electronic element disposed on one side of the first substrate;
 a second substrate disposed on one side of the electronic element;
 a first coupling body disposed between the first substrate and the second substrate;
 a second coupling body disposed between the first substrate and the second substrate, and shorter than the first coupling body; and
 a sealing part which seals at least the electronic element, wherein
 the first coupling body may not be electrically connected to the electronic element,
 the second coupling body may be electrically connected to the electronic element.

In the electronic module according to the present invention,
 the second coupling body may have an elastic structure.

In the electronic module according to the present invention,
 the first coupling body may have a main body part and a joining part having a smaller cross-sectional area than the main body part.

In the electronic module according to the present invention,
 the first coupling body may have an inclined part whose cross-sectional area is continuously reduced.

In the electronic module according to the present invention,
 a plurality of first coupling bodies may be provided, and a plurality of second coupling bodies may be provided.

In the electronic module according to the present invention,
 the first coupling body and the second coupling body may be paired.

In the electronic module according to the present invention,
 a number of first coupling bodies may be equal to a number of second coupling bodies.

In the electronic module according to the present invention,
 the first coupling body may be coupled to a first conductor layer which is disposed on the first substrate or the first substrate via a conductive adhesive, and coupled to a second conductor layer which is disposed on the second substrate or the second substrate via a conductive adhesive,
 the second coupling body may be coupled to the first conductor layer which is disposed on the first substrate or the first substrate via a conductive adhesive, and coupled to the second conductor layer which is disposed on the second substrate or the second substrate via a conductive adhesive, and
 a thickness of the conductive adhesive that is in contact with the second coupling body may be larger than a thickness of the conductive adhesive that is in contact with the first coupling body.

In the electronic module according to the present invention,
 the second coupling body may be provided between the electronic element and the second substrate, the electronic element and the first substrate or a first electronic element disposed on a side of the first substrate and a second electronic element disposed on a side of the second substrate.

In the electronic module according to the present invention,
 the second coupling body may be disposed on a peripherally inner side compared with the first coupling body.

A method for manufacturing electronic module according to the present invention may comprise the steps of:
 disposing an electronic element on one side of a first substrate;

disposing a first coupling body, which is not electrically connected to the electronic element, between the first substrate and a second substrate;

disposing a second coupling body, which is shorter than the first coupling body and electrically connected to the electronic element, between the first substrate and the second substrate; and supplying sealing resin between the first substrate and the second substrate to seal the electronic element, the first coupling body and the second coupling body with the sealing resin.

Advantageous Effects of Invention

According to one aspect of the present invention, since the first coupling body and the second coupling body are provided, it is possible to prevent the warpage or distortion of the first substrate and the second substrate. Further, the first coupling body which is not electrically connected to the electronic element is longer than the second coupling body which is electrically connected to the electronic element. Thus, even when a pressing force is applied from the metal mold, the pressing force can be received by the first coupling body. As a result, it is possible to prevent the occurrence of a trouble in the second coupling body which is electrically connected to the electronic element and performs an electric function, and, further, reduce the possibility of the occurrence of an electric trouble in the electronic module.

BRIEF DESCRIPTION OF DRAWINGS

FIG. 3 illustrates the first coupling bodies and the second coupling bodies which are located inside the sealing part.

FIGS. 7(*a*) to (*c*) are longitudinal sectional views corresponding to FIG. 1.

DESCRIPTION OF EMBODIMENTS

First Embodiment

<<Configuration>>

Figure 1:
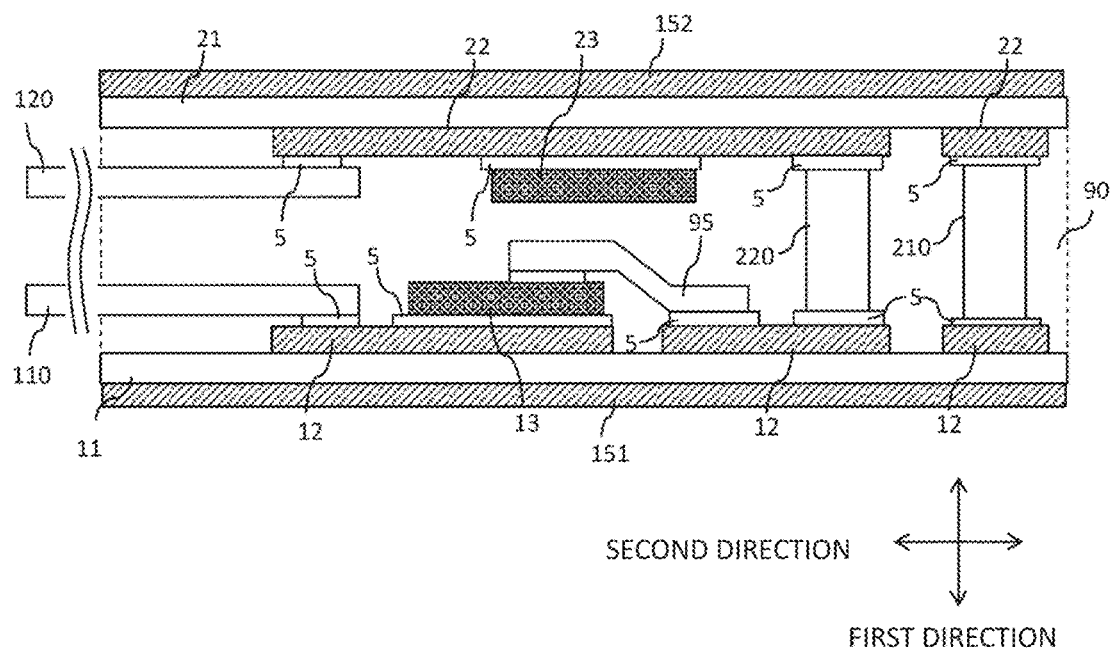
FIG. 1 is a longitudinal sectional view of an electronic module which may be used in a first embodiment of the present invention.

In the present embodiment, "one side" means the upper side of FIG. 1, and "the other side" means the lower side of FIG. 1. An up-down direction of FIG. 1 is referred to as a "first direction", a right-left direction is referred to as a "second direction", and a front-back direction of the sheet is referred to as a "third direction". A direction of a plane including the second direction and the third direction is referred to as a "plane direction", and view from one side is referred to as "plan view".

An electronic module of the present embodiment may have a first electronic unit and a second electronic unit.

As illustrated in FIG. 1, the first electronic unit may have a first substrate 11, a plurality of first conductor layers 12 which are disposed on one side of the first substrate 11, and a first electronic element 13 which is disposed on one side of the first conductor layer 12. The first electronic element 13 may be either a switching element or a control element. When the first electronic element 13 is a switching element, the first electronic element 13 may be a MOSFET or an IGBT. Further, a diode, a transistor, or a thyristor can also be used as the first electronic element 13. Each of the first electronic element 13 and a second electronic element 23 (described below) may include a semiconductor element, and a semiconductor material may be silicon, silicon carbide, or gallium nitride. The first electronic element 13 may be connected to the first conductor layer 12 via a conductive adhesive 5 such as solder.

Figure 2:
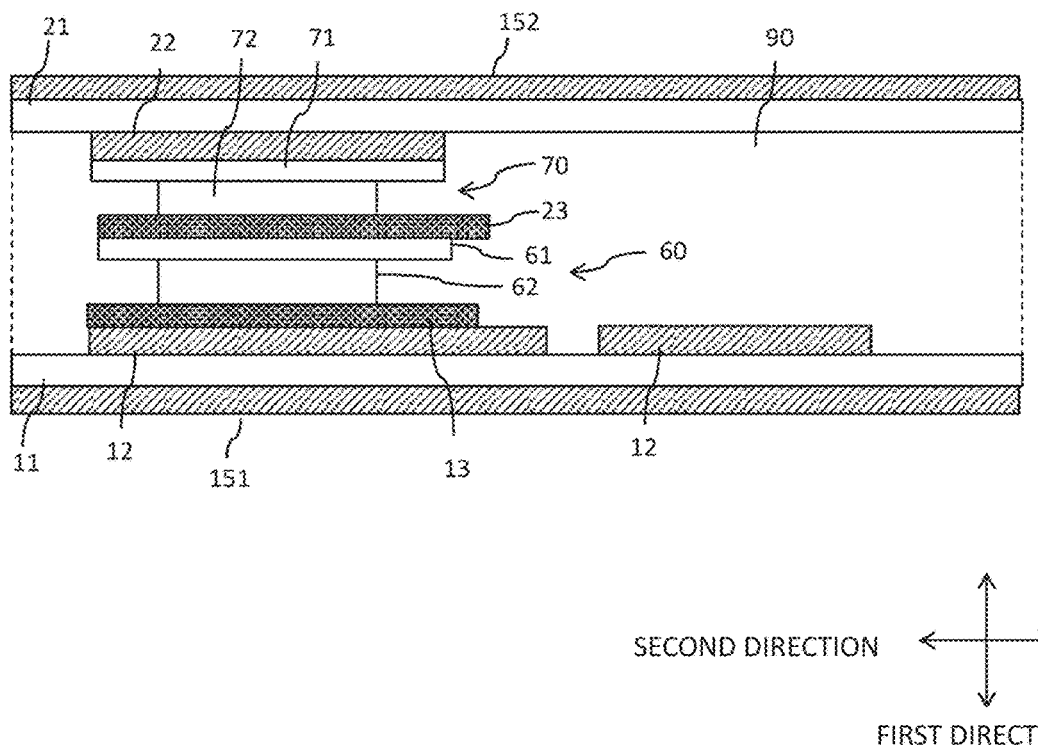
FIG. 2 is another longitudinal sectional view of the electronic module which may be used in the first embodiment of the present invention.

As illustrated in FIG. 2, a first connecting body 60 may be disposed on one side of the first electronic element 13. The first connecting body 60 may be connected to the first electronic element 13 via the conductive adhesive 5 (not illustrated in FIG. 2) such as solder.

As illustrated in FIG. 1, the second electronic unit may have a second substrate 21 and a second conductor layer 22 which is disposed on the other side of the second substrate 21. The second electronic element 23 may be disposed on the second substrate 21 via the conductive adhesive 5 such as solder.

As illustrated in FIG. 2, the second electronic element 23 may also be disposed on one side of the first connecting body 60. A second connecting body 70 may be disposed on the other side of the second conductor layer 22. The second connecting body 70 may be connected to the second electronic element 23 and the second conductor layer 22 via the conductive adhesive 5 such as solder.

The second electronic element 23 may be either a switching element or a control element. When the second electronic element 23 is a switching element, the second electronic element 23 may be a MOSFET or an IGBT. Further, a diode, a transistor, or a thyristor can also be used as the second electronic element 13.

As illustrated in FIG. 2, the first connecting body 60 may have a first head part 61 and a first column part 62 which extends to the other side from the first head part 61. The second connecting body 70 may have a second head part 71 and a second column part 72 which extends to the other side from the second head part 71. The first connecting body 60 may have a substantially T-shaped section, and the second connecting body 70 may also have a substantially T-shaped section.

A ceramic substrate or an insulating resin layer can be used as the first substrate 11 and the second substrate 21. A material containing Ag or Cu as a main ingredient can also be used as the conductive adhesive 5 in addition to solder. Metal such as Cu can be used as the material of the first connecting body 60 and the second connecting body 70. Note that, for example, a metal substrate with circuit patterning can also be used as the substrates 11, 21. In this case, the substrates 11, 21 also serve as the conductor layers 12, 22. Note that copper, aluminum, or molybdenum can be used as the metal substrate or the conductor layers 12, 22.

The electronic module may have a sealing part 90 which is such a sealing resin which seals the first electronic element 13, the second electronic element 23, the first connecting body 60, the second connecting body 70, the first conductor layer 12, and the second conductor layer 22 described above.

As illustrated in FIG. 1, terminal parts 110, 120 may have a first terminal part 110 which is electrically connected to the first electronic element 13 and a second terminal part 120 which is electrically connected to the second electronic element 23.

The first conductor layer 12 may be connected to the first terminal part 110 via the conductive adhesive 5, and a tip side of the first terminal part 110 may be exposed to the outside of the sealing part 90 so as to be connectable to an external device. The second conductor layer 22 may be connected to the second terminal part 120 via the conductive adhesive 5, and a tip side of the second terminal part 120 may be exposed to the outside of the sealing part 90 so as to be connectable to an external device. The tip of the first terminal part 110 and the tip of the second terminal part 120 may be bent to one side or the other side.

Although FIG. 1 illustrates an aspect in which the first terminal part 110 and the second terminal part 120 have a linear shape, the present embodiment is not limited thereto. The first terminal part 110 may have a first terminal base end part which is connected to the first conductor layer 12, a first terminal external part which is exposed to the outside of the sealing part 90, and a first bent part which is disposed between the first terminal base end part and the first terminal external part and bent to the other side at the first terminal base end part side. The first terminal base end part may be connected to the first conductor layer 12 via the conductive adhesive 5.

The second terminal part 120 may have a second terminal base end part which is connected to the second conductor layer 22, a second terminal external part which is exposed to the outside of the sealing part 90, and a second bent part which is disposed between the second terminal base end part and the second terminal external part and bent to one side at the second terminal base end part side. The second terminal base end part may be connected to the second conductor layer 22 via the conductive adhesive 5.

A first coupling body 210 and a second coupling body 220 which is shorter than the first coupling body 210 may be disposed between the first substrate 11 and the second substrate 21. The first coupling body 210 may not be electrically connected to the electronic elements 13, 23, and the second coupling body 220 may be electrically connected to the electronic elements 13, 23. For example, the first coupling body 210 may be electrically connected to the electronic elements 13, 23 via the conductor layers 12, 22. Note that the present embodiment is not limited to such an aspect, and an aspect in which the first coupling body 210 and the second coupling body 220 have substantially the same length can also be employed. Here, having substantially the same length means that the different between the length of the first coupling body 210 and the length of the second coupling body 220 falls within 5% of the length of the longer one of the first coupling body 210 and the second coupling body 220. Thus, it can be said that the first coupling body 210 and the second coupling body 220 have substantially the same length in the present embodiment when $L_1 - L_0 \leq L_1 \times 0.05$ is satisfied, where $L_1$ denotes the length of the longer one of the first coupling body 210 and the second coupling body 220, and $L_0$ denotes the length of the shorter one of them.

The length of the first coupling body 210 in the first direction may be a length corresponding to a designed height (the distance in the first direction) between the first substrate 11 and the second substrate 21. Here, the "length corresponding to the designed height" means that the length falls within ±5% of the designed height. Note that when the sealing resin to be the sealing part 90 is injected into a metal mold, the first substrate 11 and the second substrate 21 or a first heat plate 151 and a second heat plate 152 (described below) are pressed by the metal mold from one side.

The first coupling body 210 may have a columnar shape such as a cylindrical shape or a prism shape. Similarly, the second coupling body 220 may have a columnar shape such as a cylindrical shape or a prism shape. The shape of the first coupling body 210 and the shape of the second coupling body 220 are not necessarily similar to each other. The first coupling body 210 may have a cylindrical shape and the second coupling body 220 may have a prism shape, or the first coupling body 210 may have a prism shape and the second coupling body 220 may have a cylindrical shape.

Figure 3:
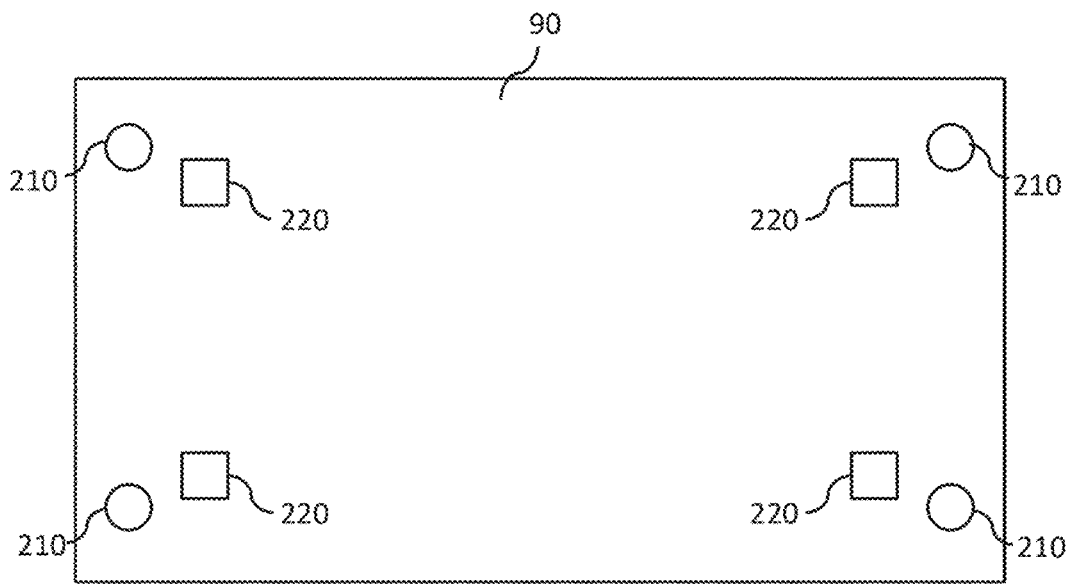
FIG. 3 is a plan view illustrating first coupling bodies and second coupling bodies which may be used in the first embodiment of the present invention. Although the first coupling bodies and the second coupling bodies inside a sealing part are not visible in practice.
Figure 4:
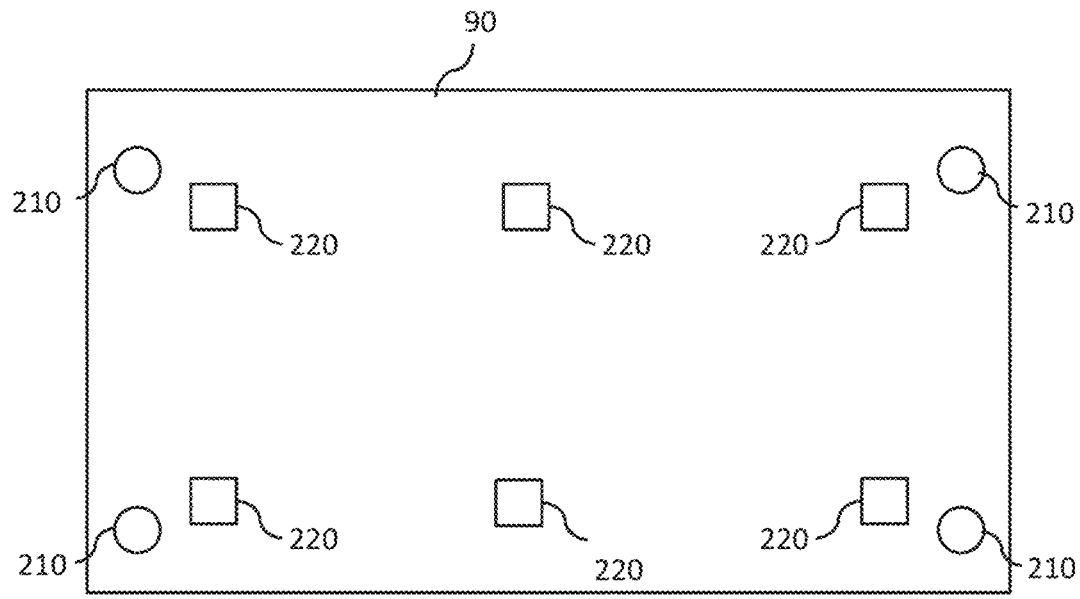
FIG. 4 is another plan view illustrating first coupling bodies and second coupling bodies which may be used in the first embodiment of the present invention. Although the first coupling bodies and the second coupling bodies inside the sealing part are not visible in practice, FIG. 4 also illustrates the first coupling bodies and the second coupling bodies which are located inside the sealing part.

Only one first coupling body 210 may be provided, or a plurality of first coupling bodies 210 may be provided as illustrated in FIGS. 3 and 4. Similarly, only one second coupling body 220 may be provided, or a plurality of second coupling bodies 220 may be provided as illustrated in FIGS. 3 and 4. As illustrated in FIG. 3, the number of first coupling bodies 210 may be equal to the number of second coupling bodies 220, and the first coupling body 210 and the second coupling body 220 may be paired. Here, "being paired" means that one second coupling body 220 located at the shortest distance from the first coupling body 210 in the plane direction is provided, and the first coupling body 210 and the second coupling body 220 are paired.

The second coupling body 220 may be disposed on a peripherally inner side compared with the first coupling body 210. When a plurality of second coupling bodies 220 is employed, each of the second coupling bodies 220 may be located on the peripherally inner side compared with the first coupling body 210. However, the present embodiment is not limited to such an aspect, and the second coupling body 220 may be disposed on a peripherally outer side compared with the first coupling body 210. The "peripherally inner side" means that the distance from the peripheral edge of the sealing part 90 is long in the plane direction. The second coupling body 220 located on the peripherally inner side compared with the first coupling body 210 means that the distance between the second coupling body 220 and the peripheral edge of the sealing part 90 is longer than the distance between the first coupling body 210 and the peripheral edge of the sealing part 90.

At least one first coupling body 210 may be coupled to the first conductor layer 12 which is disposed on the first substrate 11 or the first substrate 11 which includes the metal substrate via the conductive adhesive 5 and coupled to the second conductor layer 22 which is disposed on the second substrate 21 or the second substrate 21 which includes the metal substrate via the conductive adhesive 5.

At least one second coupling body 220 may be coupled to the first conductor layer 12 which is disposed on the first substrate 11 or the first substrate 11 which includes the metal substrate via the conductive adhesive 5 and coupled to the second conductor layer 22 which is disposed on the second substrate 21 and the second substrate 21 which includes the metal substrate via the conductive adhesive 5.

As illustrated in FIG. 1, the thickness of the conductive adhesive 5 that is in contact with the first coupling body 210 may be smaller than the thickness of the conductive adhesive 5 that is in contact with the second coupling body 220. The second coupling body 220 is shorter than the first coupling body 210. Thus, when the first coupling body 210 and the second coupling body 220 are coupled to the first conductor layer 12 or the first substrate 11 which includes the metal substrate via the conductive adhesive 5 and coupled to the second conductor layer 22 or the second substrate 21 which includes the metal substrate via the conductive adhesive 5 in a similar aspect, the thickness of the conductive adhesive 5 that is in contact with the second coupling body 220 can substantially inevitably be made larger than the thickness of the conductive adhesive 5 that is in contact with the first coupling body 210. The second coupling body 220 is electrically connected to the electronic element. Thus, high reliability can be achieved by such a sufficient thickness of the conductive adhesive 5.

Figure 5:
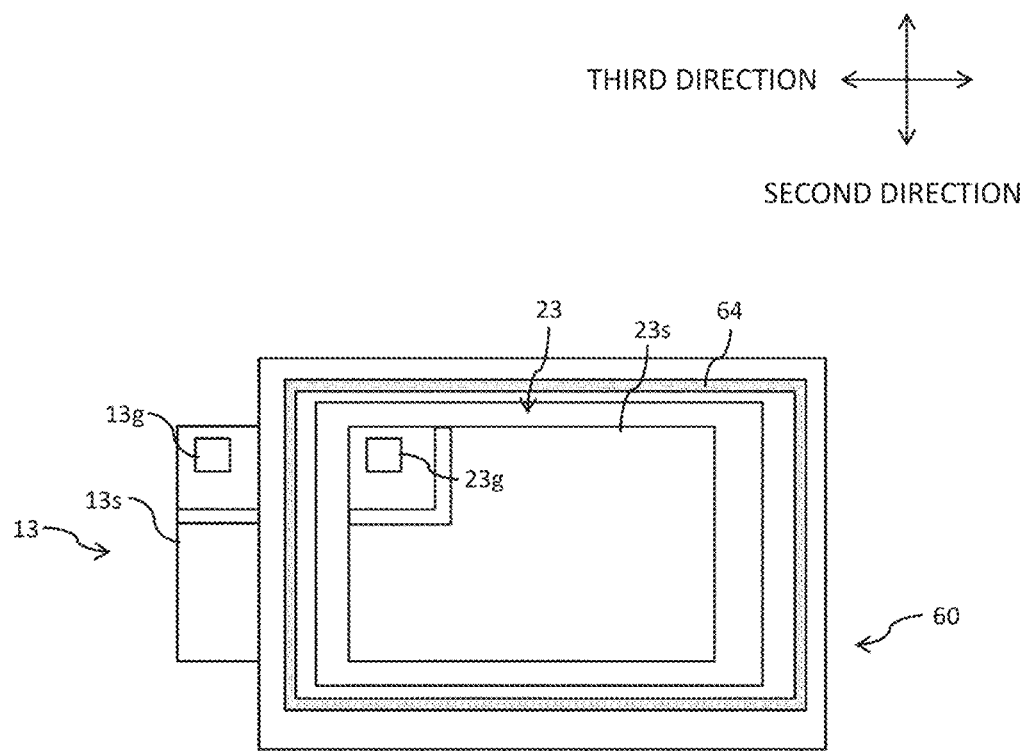
FIG. 5 is a plan view illustrating a first connecting body, a first electronic element, and a second electronic element which may be used in the first embodiment of the present invention.

As illustrated in FIG. 5, a first groove 64 may be formed on a one-side face of the first head part 61. The first groove 64 is formed on the peripherally outer side of the first column part 62 in plan view (plane direction). The first groove 64 may be partially or entirely formed on the peripherally outer side of the first column part 62. The conductive adhesive 5 such as solder may be disposed on the one-side face of the first head part 61 on the peripherally inner side of the first groove 64, and the second electronic element 23 may be disposed via the conductive adhesive 5.

As illustrated in FIG. 5, the first electronic element 13 may be exposed outward from the first head part 61 in plan view. When the first electronic element 13 is a switching element such as a MOSFET, a first gate terminal 13g may be disposed on the part exposed outward. Similarly, when the second electronic element 23 is a switching element such as a MOSFET, a second gate terminal 23g may be disposed on a one-side face of the second electronic element 23. The first electronic element 13 illustrated in FIG. 5 has the first gate terminal 13g and a first source terminal 13s on a one-side face thereof, and the second electronic element 23 has the second gate terminal 23g and a second source terminal 23s on the one-side face thereof. In this case, the second connecting body 70 may be connected to the second source terminal 23s of the second electronic element 23 via the conductive adhesive 5, and a connector (not illustrated) may be connected to the second gate terminal 23g of the second electronic element 23 via the conductive adhesive 5. Further, the first connecting body 60 may connect the first source terminal 13s of the first electronic element 13 to a second drain terminal which is disposed on the other side of the second electronic element 23 via the conductive adhesive 5. A first drain terminal which is disposed on the other side of the first electronic element 13 may be connected to the first conductor layer 12 via the conductive adhesive 5. The first gate terminal 13g of the first electronic element 13 may be connected to a connector (not illustrated) via the conductive adhesive 5, and the connector 95 may be connected to the first conductor layer 12 via the conductive adhesive 5.

When only either the first electronic element 13 or the second electronic element 23 is a switching element, it can be considered that the second electronic element 23 which is mounted on the first connecting body 60 is a control element having a low heat generating property, and the first electronic element 13 is a switching element. Conversely, it can also be considered that the second electronic element 23 which is mounted on the first connecting body 60 is a switching element, and the first electronic element 13 is a control element having a low heat generating property.

The terminal parts 110, 120 and the conductor layers 12, 22 may be joined together by using not only the conductive adhesive 5 such as solder, but also using laser beam welding or ultrasonic bonding. The terminal parts 110, 120 may be disposed on a peripheral side part opposite to the first coupling body 210 or the second coupling body 220. For example, as illustrated in FIG. 1, the first coupling body 210 may be disposed on the peripherally outer side of the second coupling body 220, the terminal parts 110, 120 may be disposed on the peripheral side part opposite to the first coupling body 210 and the second coupling body 220, and the terminal parts may project to the peripherally outer side of the sealing part 90.

As illustrated in FIGS. 1 and 2, the first heat plate 151 which includes a copper substrate may be disposed on the other side (back side) of the first substrate 11. Similarly, the second heat plate 152 which includes a copper substrate may be disposed on one side (back side) of the second substrate 12.

<<Manufacturing Method>>

Next, an example of a method for manufacturing the electronic module of the present embodiment will be described.

Figure 6:
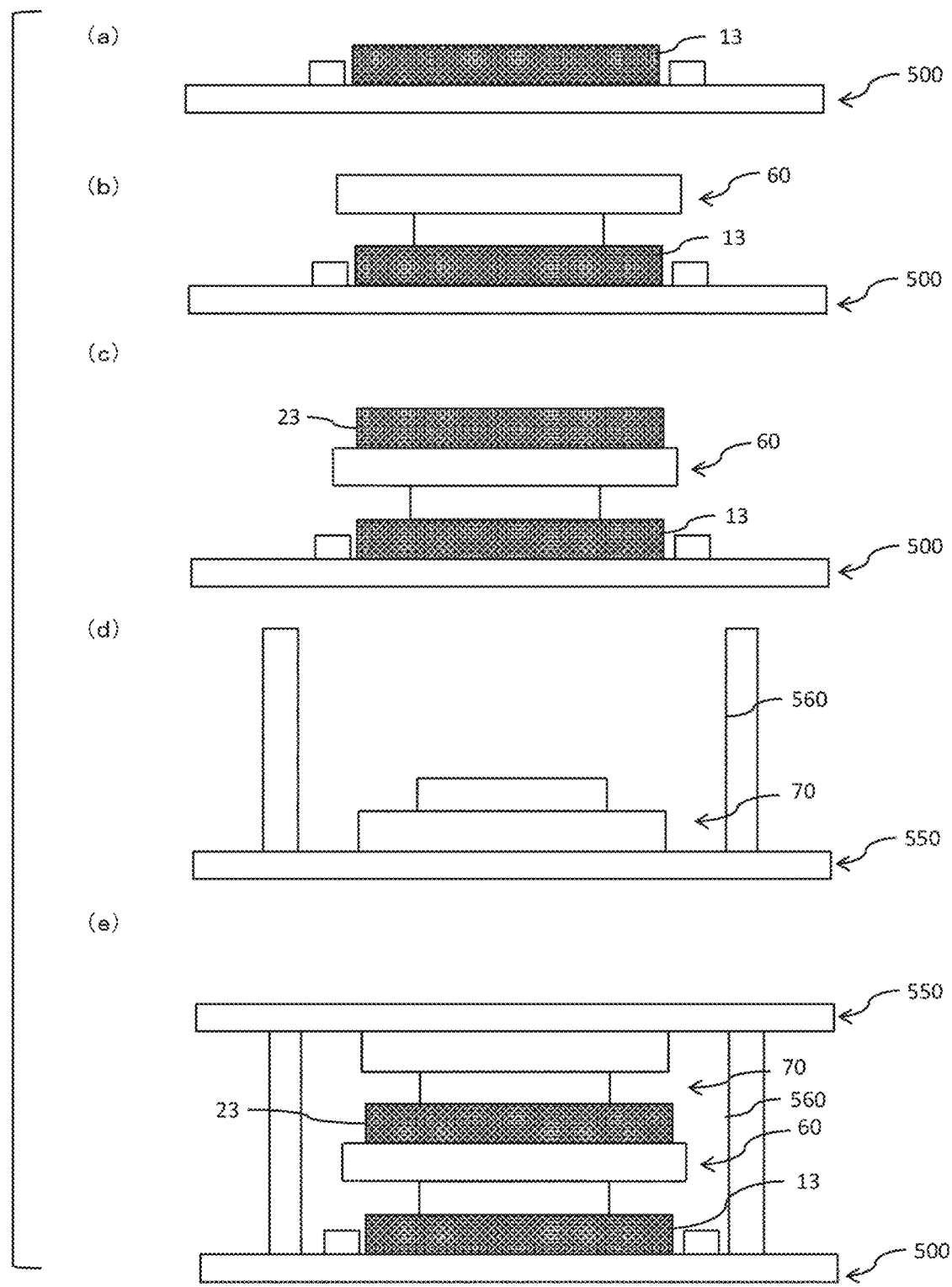
FIGS. 6(*a*) to (*e*) are longitudinal sectional views illustrating a manufacturing process of a chip module which may be used in the first embodiment of the present invention.

First, the first electronic element 13 is disposed on a first jig 500 (a first electronic element disposing step, refer to FIG. 6(a)). Note that FIG. 6 illustrates a process for manufacturing a chip module different from FIG. 2. For example, the second electronic element 23 is small enough to fit inside the first connecting body 60 in the plane direction.

Next, the first connecting body 60 is disposed on the first electronic element 13 via the conductive adhesive 5 such as solder (a first connecting body disposing step, refer to FIG. 6(b)). Note that the conductive adhesive 5 such as solder is not illustrated in FIG. 6.

Next, the second electronic element 23 is disposed on the first connecting body 60 via the conductive adhesive 5 (a second electronic element disposing step, refer to FIG. 6(c)). Note that the conductive adhesive 5 on the first connecting body 60 is disposed on the peripherally inner side of the first groove 64 of the first electronic element 13.

The second connecting body 70 is disposed on a second jig 550 (a second electronic element disposing step, refer to FIG. 6(d)). The second jig 550 may have a plurality of jig recesses 560 at a position where the second connecting body 70 is disposed. The height of the jig recess 560 may correspond to the height of the chip module. Note that the height of the jig recess 560 corresponding to the height of the chip module means that the jig recess 560 has a height equal to or more than a designed thickness of the entire chip module also taking the thickness of the conductive adhesive 5 into consideration.

The second jig 550 with the second connecting body 70 adhered thereto by a suction member is inverted, and the second connecting body 70 is disposed on the second electronic element 23 via the conductive adhesive 5 (an inverted mounting step, refer to FIG. 6(e)).

Next, the conductive adhesive 5 is melted by applying heat thereto and then cured (reflowed) (a first curing step). In this manner, the chip module having the first electronic element 13 and the second electronic element 23 is manufactured.

Figure 7:
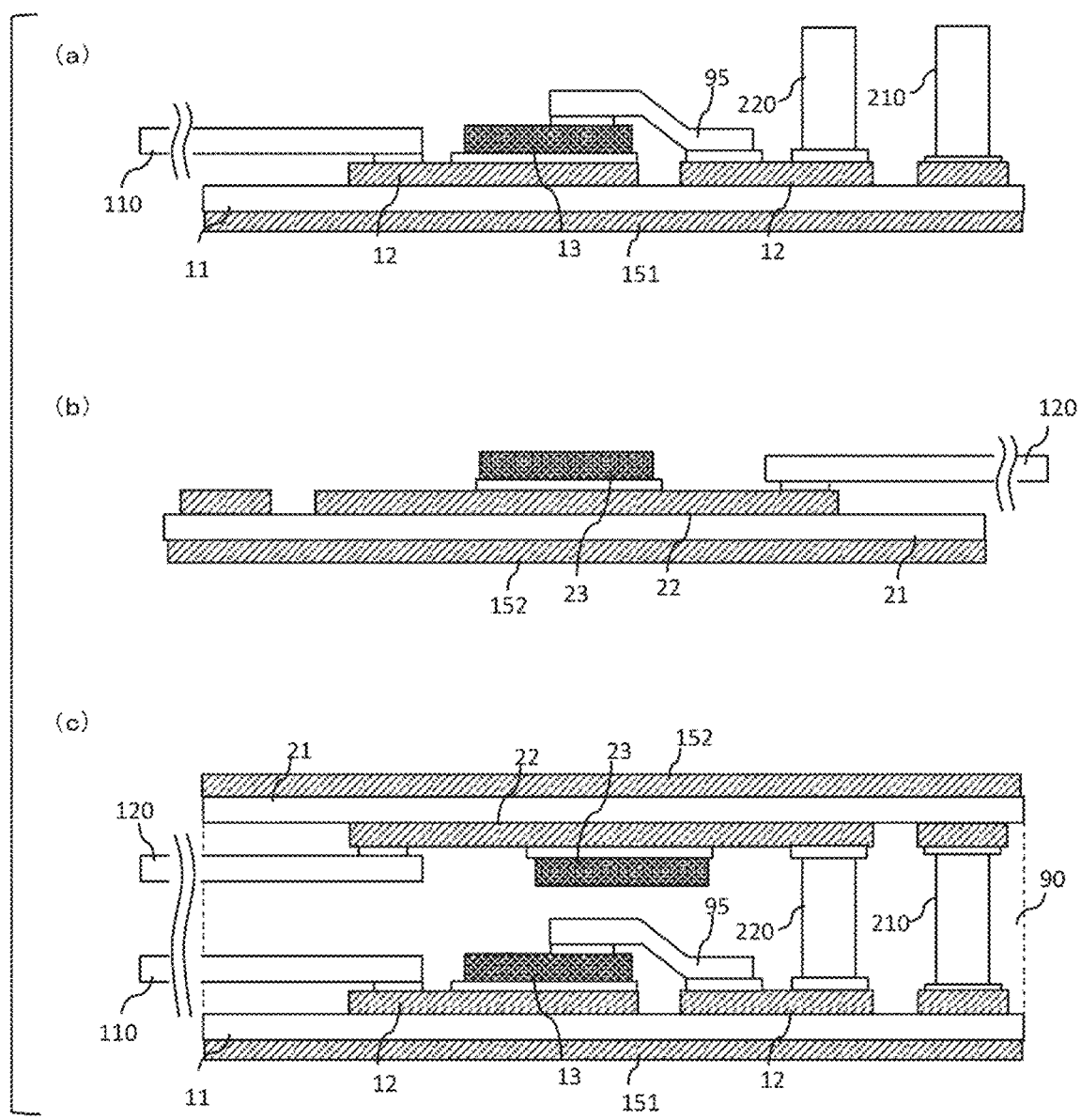
FIGS. 7(*a*) to (*c*) are longitudinal sectional views illustrating a manufacturing process of an electronic module which may be used in the first embodiment of the present invention.

Next, a method for manufacturing the electronic module will be described. Note that the chip module is not illustrated in FIG. 7.

The first electronic element 13 of the chip module is mounted on the first conductor layer 12, which is disposed on the first substrate 11, via the conductive adhesive 5 (a chip module mounting step).

Simultaneously with, or before or after the chip module mounting step, the first electronic element 13 is mounted on the first conductor layer 12 via the conductive adhesive 5 (a first electronic element mounting step, refer to FIG. 7(a)). The connector 95 is mounted on the first electronic element 13 and the first conductor layer 12 via the conductive adhesive 5.

Simultaneously with, or before or after the first electronic element mounting step, the first coupling body 210 is disposed on the first conductor layer 12 on the front side of the first substrate 11 via the conductive adhesive 5 (a first coupling body mounting step, refer to FIG. 7(a)).

Simultaneously with, or before or after the first coupling body mounting step, the second coupling body 220 is disposed on the first conductor layer 12 on the front side of the first substrate 11 via the conductive adhesive 5 (a second coupling body mounting step, refer to FIG. 7(a)).

Simultaneously with, or before or after the second coupling body mounting step, the first terminal part 110 is disposed on the first conductor layer 12 on the front side of the first substrate 11 via the conductive adhesive 5.

The second electronic element 23 is disposed on the second conductor layer 22 on the front side of the second substrate 21 via the conductive adhesive 5 (a second electronic element mounting step, refer to FIG. 7(b)).

Simultaneously with, or before or after the second electronic element mounting step, the second terminal part 120 is disposed on the second conductor layer 22 on the front side of the second substrate 21 via the conductive adhesive 5.

Next, the conductive adhesive 5 disposed on the first substrate 11 side and the second substrate 21 side is melted by applying heat thereto and then cured (reflowed).

Next, the second substrate 21 is inverted, and the first coupling body 210 and the second coupling body 220 are connected to the second conductor layer 22 of the second substrate 21 via the conductive adhesive 5 (an inverting step, refer to FIG. 7(c)). At this time, the second conductor layer 22 is connected to the second connecting body 70 of the chip module via the conductive adhesive 5.

Next, the sealing resin is supplied between the first substrate 11 and the second substrate 21 to seal the chip module, the first electronic element 13, the second electronic element 23, the first coupling body 210, and the second coupling body 220 with the sealing resin to form the sealing part 90 (a sealing step, refer to FIG. 7(c)).

The electronic module of the present embodiment is manufactured as described above.

<<Action/Effect>>

Next, an example of the action/effect according to the present embodiment having the above configuration will be described. Note that all aspects described in the "action/effect" can be employed in the above configuration.

In the present embodiment, when the aspect in which the first coupling body 210 and the second coupling body 220 are provided is employed, it is possible to prevent warpage or distortion of the first substrate 11 and the second substrate 21. More specifically, when heat is applied in the process of manufacturing the electronic module, there is a possibility that the first substrate 11 and the second substrate 21 are warped or distorted. For example, in a soldering process and a reflow process, there is a possibility that the first substrate 11 and the second substrate 21 are warped or distorted due to the application of heat. In this point, when the aspect in which the first coupling body 210 and the second coupling body 220 are provided is employed, it is possible to prevent such warpage or distortion of the first substrate 11 and the second substrate 21. Note that such warpage and distortion become larger as the size of the first substrate 11 and the second substrate 21 in the plane direction increases. Thus, in such a case, it is extremely useful to use the first substrate 11 and the second substrate 21 of the present embodiment.

Further, it is possible to prevent the warpage or distortion of the first substrate 11 and the second substrate 21 also by employing the first connecting body 60 or the second connecting body 70. Further, it is possible to efficiently dissipate heat generated from the first electronic element 13 or the second electronic element 23 by employing the first connecting body 60 or the second connecting body 70.

Since there are tolerances in a member including the first substrate 11 and the second substrate 21, the thickness of assembled components of the electronic module in the thickness direction (first direction) may become larger than the thickness of the metal mold in the thickness direction. When a strong pressing force is applied from the metal mold in such a case, there is a possibility of the occurrence of an electric trouble. In this point, when the aspect in which the first coupling body 210 which is not electrically connected to the electronic element is longer than the second coupling body 220 which is electrically connected to the electronic element is employed, a pressing force which may be applied from the metal mold can be received by the first coupling body 210. As a result, it is possible to prevent the occurrence of a trouble in the second coupling body 220 which is electrically connected to the electronic element and performs an electric function, and, further, reduce the possibility of the occurrence of an electric trouble in the electronic module.

It is acceptable that the first coupling body 210 be damaged when a strong pressing force is applied from the metal mold. In view of this, it is useful to employ the aspect in which the first coupling body 210 is disposed on the peripherally outer side compared with the second coupling body 220. This is because, when an effect of the warpage or distortion of the first substrate 11 and the second substrate 21 is taken into consideration, there is a high possibility that a large force is applied to the peripherally outer side.

The thickness of the conductive adhesive 5 that is in contact with the second coupling body 220 may be larger than the thickness of the conductive adhesive 5 that is in contact with the first coupling body 210. This is useful in that, since the second coupling body 220 is electrically connected to the electronic element, high reliability can be achieved by such a sufficient thickness of the conductive adhesive 5.

The employment of the aspect in which a plurality of first coupling bodies 210 is provided as illustrated in FIGS. 3 and 4 is useful in that the warpage or distortion of the first substrate 11 and the second substrate 21 can be more reliably prevented. For example, at least four first coupling bodies 210 may be provided so that the first coupling bodies 210 can support four corners of the first substrate 11 and four corners of the second substrate 21.

The employment of the aspect in which a plurality of second coupling bodies 220 is provided as illustrated in FIGS. 3 and 4 is also useful in that the warpage or distortion of the first substrate 11 and the second substrate 21 can be more reliably prevented. For example, at least four second coupling bodies 220 may be provided so that the second coupling bodies 220 can support the four corners of the first substrate 11 and the four corners of the second substrate 21.

The employment of the aspect in which the first coupling body 210 and the second coupling body 220 are paired is useful in that the first coupling body 210 can prevent a pressing force caused by the warpage or distortion of the first substrate 11 and the second substrate 21 from being applied to the corresponding second coupling body 220 (the paired second coupling body 220). Note that, when an influence on the second coupling body 220 is taken into consideration, the aspect in which the number of first coupling bodies 210 is larger than the number of second coupling bodies 220 is useful. On the other hand, since the first coupling body 210 is a component that performs no electric function, reducing the number of first coupling bodies 210 is also useful. Thus, in view of reducing the number of components performing no electric function while reducing the influence on the second coupling body 220, the aspect in which the number of first coupling bodies 210 is equal to the number of second coupling bodies 220 is useful. As illustrated in FIG. 4, the number of second coupling bodies 220 may be larger than the number of first coupling bodies 210.

Second Embodiment

Next, a second embodiment of the present invention will be described.

Figure 8:
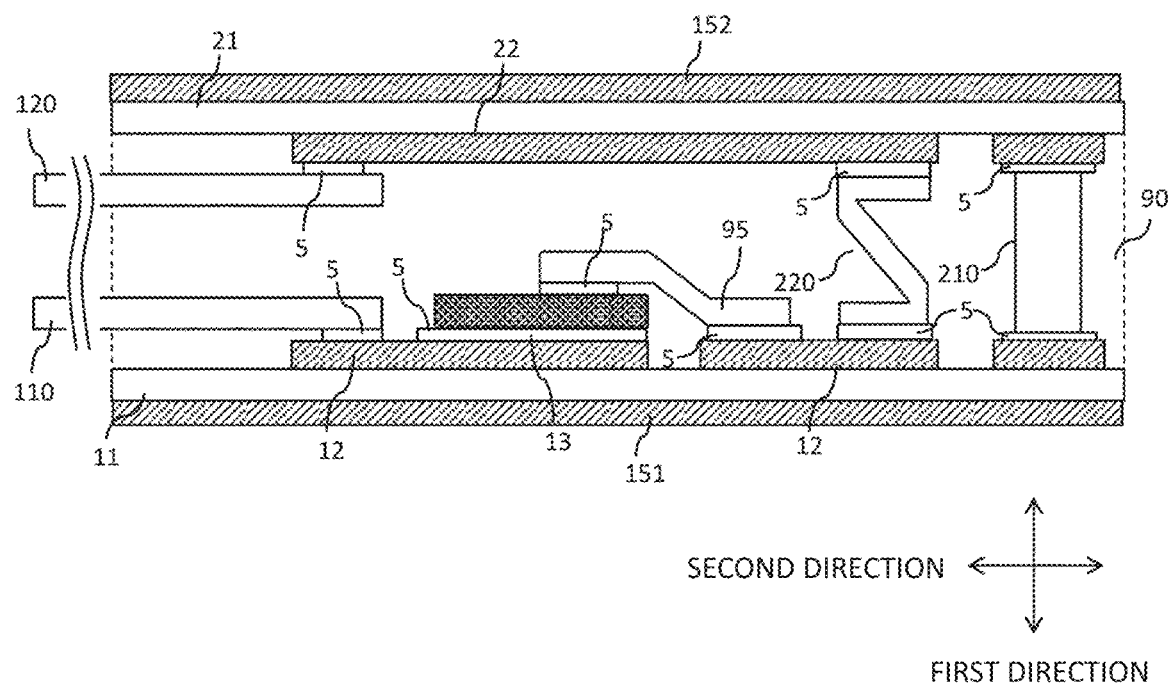
FIG. 8 is a longitudinal sectional view of an electronic module which may be used in a second embodiment of the present invention.

The first embodiment employs the aspect in which the second coupling body 220 has a columnar shape such as a cylindrical shape or a prism shape. The present embodiment employs an aspect as illustrated in FIG. 8 in which a second coupling body 220 has an elastic structure. The other configuration is similar to the first embodiment, and all the aspects described in the first embodiment can be employed. The members already described in the first embodiment will be described using the same reference signs as those in the first embodiment.

Various aspects can be employed as the elastic structure. For example, in a longitudinal section in the first direction, the elastic structure may be a Z-shaped structure as illustrated in FIG. 8, may be a C-shaped structure as illustrated in FIG. 9(a), or may be an M-shaped structure as illustrated in FIG. 9(b).

When the aspect as described in the present embodiment in which the second coupling body 220 has the elastic structure is employed, a pressing force which may be applied to the second coupling body 220 can be absorbed by the second coupling body 220 itself. Thus, it is possible to prevent the occurrence of a large trouble in the second coupling body 220 itself. Thus, it is possible to further reduce the possibility of the occurrence of an electric trouble in the electronic module.

Figure 9:
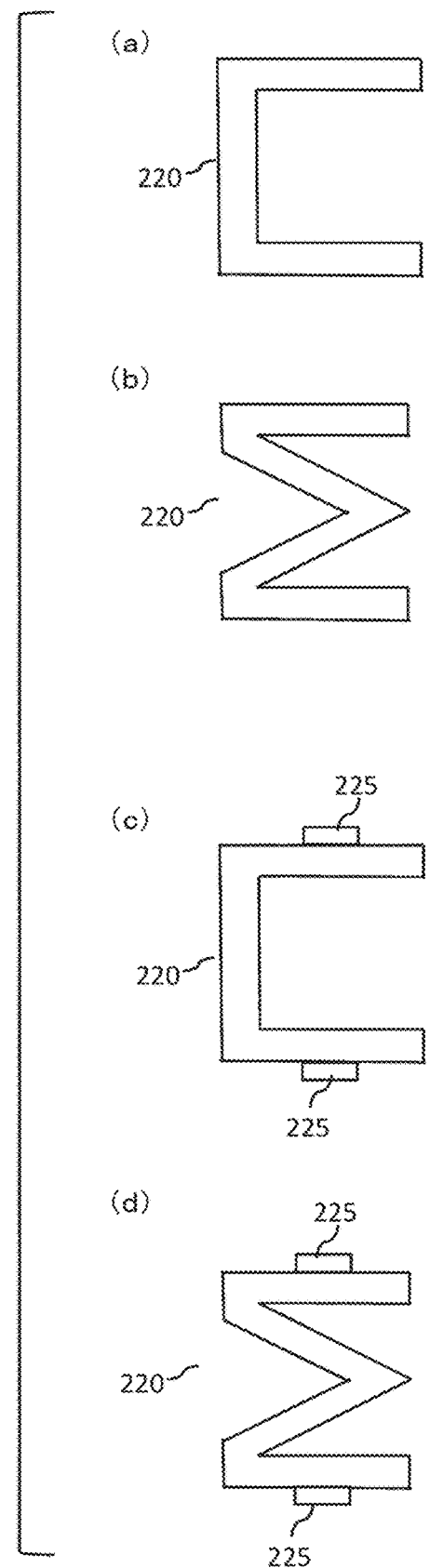
FIGS. 9(*a*) to (*d*) are longitudinal sectional views of second coupling bodies which may be used in the second embodiment of the present invention.

Further, as illustrated in FIGS. 9(c) and (d), a projecting part 225 which projects to one side may be disposed on a face of a one-side end part of the second coupling body 220. Similarly, a projecting part 225 which projects to the other side may be disposed on a face of an other-side end part of the second coupling body 220. Such a projecting part 225 is useful in that the thickness of the conductive adhesive 5 can be ensured. When a pressing force is applied to the second coupling body 220, the conductive adhesive 5 is crushed. Thus, there is a possibility that the thickness of the conductive adhesive 5 cannot be sufficiently ensured. In this point, the projecting part 225 as described in the present embodiment is useful in that a sufficient thickness of the conductive adhesive 5 can be more reliably ensured. Note that the projecting part 225 may be disposed on only either the face of the one-side end part or the face of the other-side end part of the second coupling body 220.

Third Embodiment

Next, a third embodiment of the present invention will be described.

Figure 10:
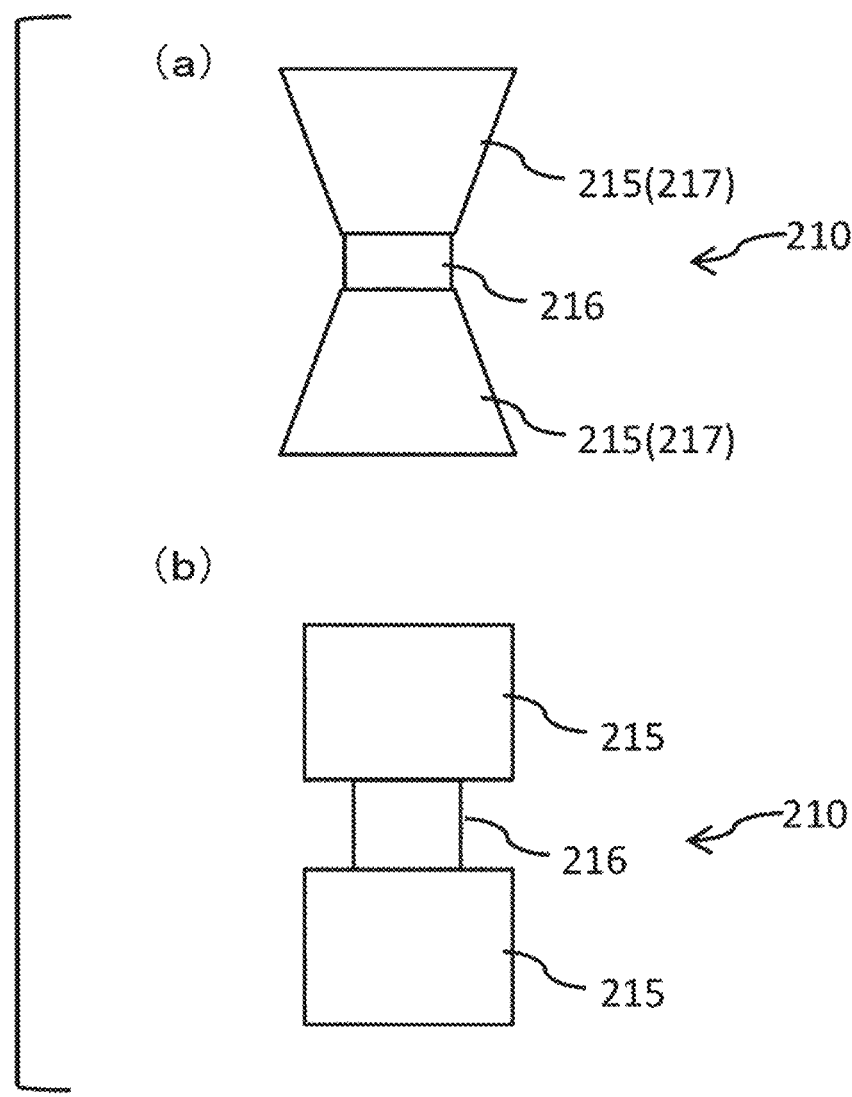
FIGS. 10(*a*) and (*b*) are longitudinal sectional views of second coupling bodies which may be used in a third embodiment of the present invention.

Each of the above embodiments employs the aspect in which the first coupling body 210 has a columnar shape such as a cylindrical shape or a prism shape. The present embodiment employs an aspect in which a first coupling body 210 has a main body part 215 and a joining part 216 having a smaller cross-sectional area than the main body part 215 as illustrated in FIG. 10. In the present embodiment, all the aspects described in each of the above embodiments can be employed. The members already described in each of the above embodiments will be described using the same reference signs as those in the above embodiments.

When the joining part 216 having a small cross-sectional area is employed as described in the present embodiment, the first coupling body 210 can be broken at the joining part 216 when an excessive force is applied from the first substrate 11 and the second substrate 21 in the first direction. Thus, it is possible to prevent an excessive force from acting on the first substrate 11 or the second substrate 21 by the first coupling body 210. The first coupling body 210 is provided for preventing the warpage or distortion of the first substrate 11 and the second substrate 21. However, there is a possibility that an excessive force is applied to the first substrate 11 or the second substrate 21 by the first coupling body 210, and, further, a trouble occurs in the first substrate 11 or the second substrate 21. When the joining part 216 as described in the present embodiment is employed, it is possible to break the first coupling body 210 at the joining part 216 when an excessive force is applied and prevent an excessive force from acting on the first substrate 11 or the second substrate 21 by the first coupling body 210.

Various shapes can be employed as the shapes of the main body part 215 and the joining part 216. For example, the main body part 215 may be a structure having an inclined part 217 (described below, refer to FIG. 10(a)) or may be a structure having a columnar shape such as a cylindrical shape or a prism shape (refer to FIG. 10(b)). For example, a structure having a columnar shape such as a cylindrical shape or a prism shape can be employed as the joining part 216. Further, the joining part 216 may be a structure having an inclined part.

Fourth Embodiment

Next, a fourth embodiment of the present invention will be described.

Figure 11:
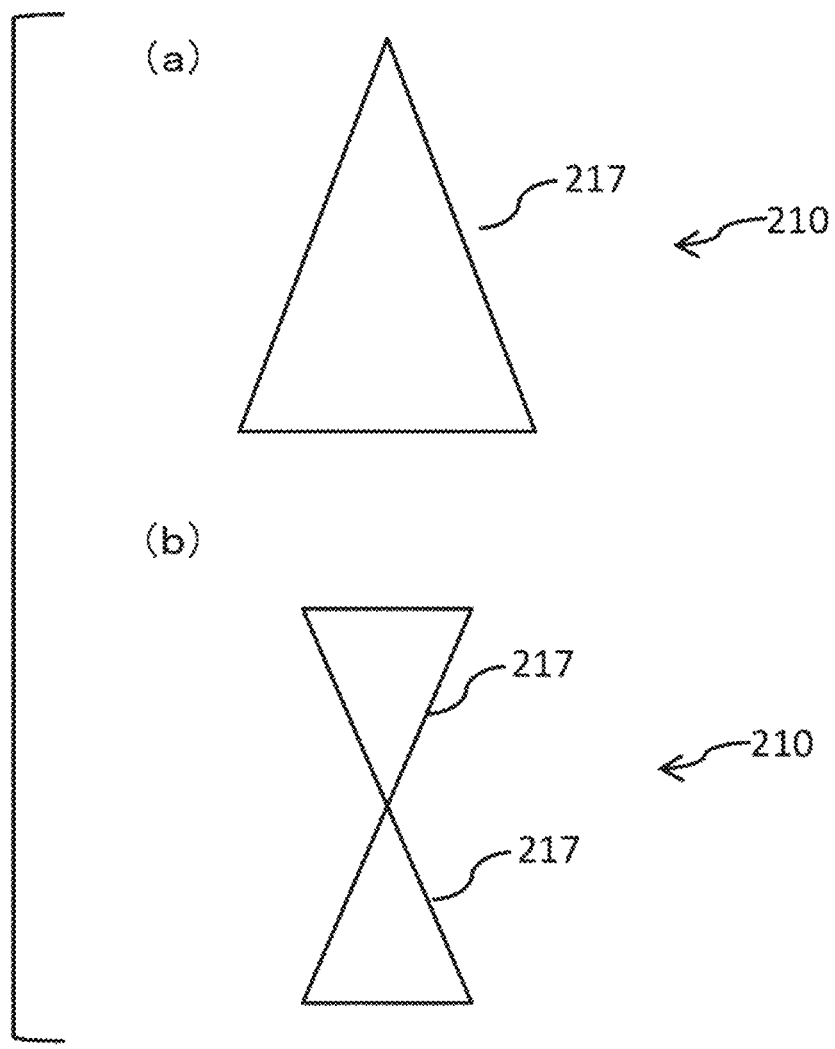
FIGS. 11(*a*) and (*b*) are longitudinal sectional views of second coupling bodies which may be used in a fourth embodiment of the present invention.

The present embodiment employs an aspect in which a first coupling body 210 has an inclined part 217 whose cross-sectional area is continuously reduced as illustrated in FIG. 11. Also in the present embodiment, all the aspects described in each of the above embodiments can be employed. The members already described in each of the above embodiments will be described using the same reference signs as those in the above embodiments.

As described above, the first coupling body 210 is provided for preventing the warpage or distortion of the first substrate 11 and the second substrate 21. However, there is a possibility that an excessive force is applied to the first substrate 11 or the second substrate 21 by the first coupling body 210, and, further, a trouble occurs in the first substrate 11 or the second substrate 21. The employment of the inclined part 217 as described in the present embodiment is useful in that a part of the first coupling body 210 is crushed at a location having a small cross section (cross section in the plane direction) in the inclined part 217 when an excessive force is applied so that it is possible to prevent an excessive force from acting on the first substrate 11 or the second substrate 21 by the first coupling body 210. Note that, in the aspect illustrated in FIG. 11(a), the location having a small cross section corresponds to a part (tip part) located on the tip side (the upper side of FIG. 11(a)). In the aspect illustrated in FIG. 11(b), the location having a small cross section corresponds to a part (central part) located on the central part (the center in the up-down direction of FIG. 11(b)).

Fifth Embodiment

Next, a fifth embodiment of the present invention will be described.

Figure 12:
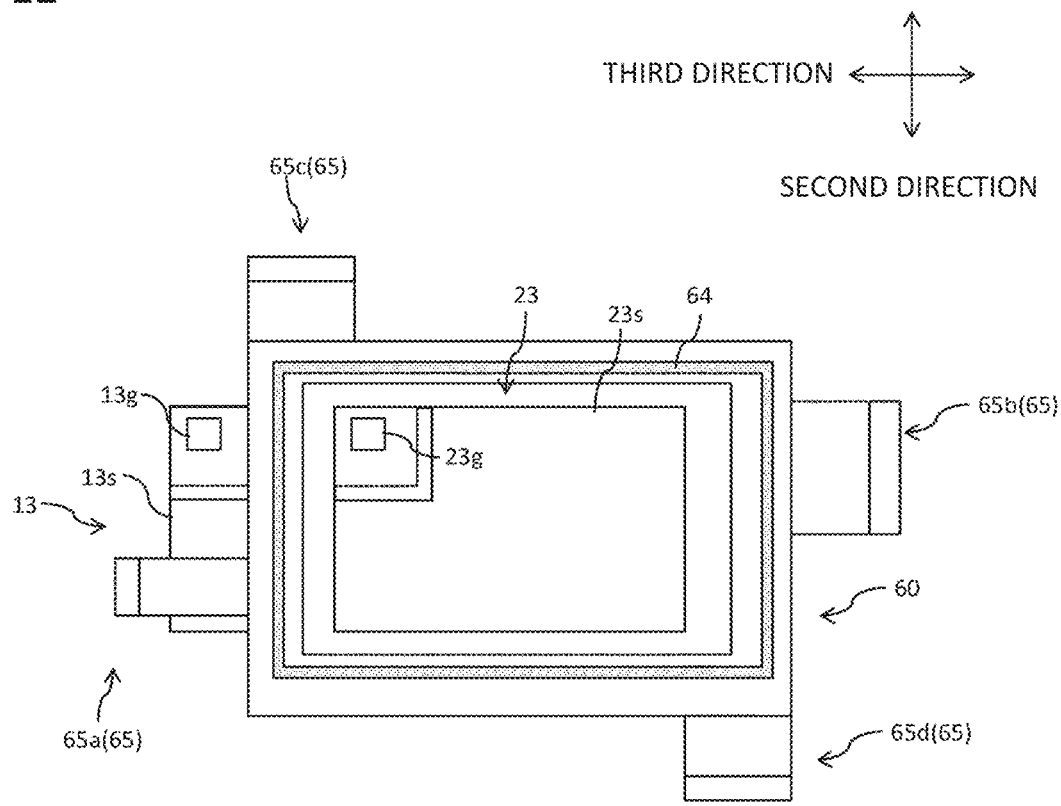
FIG. 12 is a plan view illustrating a first connecting body, a first electronic element, and a second electronic element which may be used in a fifth embodiment of the present invention.

In each of the above embodiments, the first connecting body 60 having a substantially T-shaped section is used. On the other hand, a first connecting body 60 of the present embodiment has four support parts 65 (65a to 65d) each of which extends to the other side from a first head part 61 as illustrated in FIG. 12. The support bodies 65 abut on a first conductor layer 12 or a first substrate 11. Also in the present embodiment, all the aspects described in each of the above embodiments can be employed. The members already described in each of the above embodiments will be described using the same reference signs as those in the above embodiments.

The present embodiment is described using the aspect in which the four support parts 65 are used. However, the present embodiment is not limited thereto, and one, two, three, or five or more support parts 65 may be used.

When the support part 65 which extends from the first head part 61 is provided as described in the present embodiment, it is possible to prevent the first connecting body 60 from tilting by the weight of a second electronic element 23 during or after mounting of the second electronic element 23. Further, when the support part 65 abuts on the first substrate 11 or the first conductor layer 12 in this manner, heat dissipation can be improved. In particular, the support part 65 abutting on the first conductor layer 12 is useful in that the heat dissipation can be further improved.

When the first connecting body 60 having a plurality of support parts 65 is employed as described in the present embodiment, a stronger repulsive force can be imparted against the warpage or distortion of the first substrate 11 and the second substrate 21 caused by heat. That is, although a force that causes the warpage or distortion of the first substrate 11 and the second substrate 21 is applied by the application of heat in the manufacturing process of the electronic module as described above, the use of the first connecting body 60 having a plurality of support parts 65 is useful in that it is possible to more reliably prevent the warpage or distortion of the first substrate 11 and the second substrate 21 also by the first connecting body 60 via the second electronic element 23, a second connecting body 70, a third connecting body 80, and a connector 85 in addition to the action by the first coupling body 210.

Sixth Embodiment

Next, a sixth embodiment of the present invention will be described.

Figure 13:
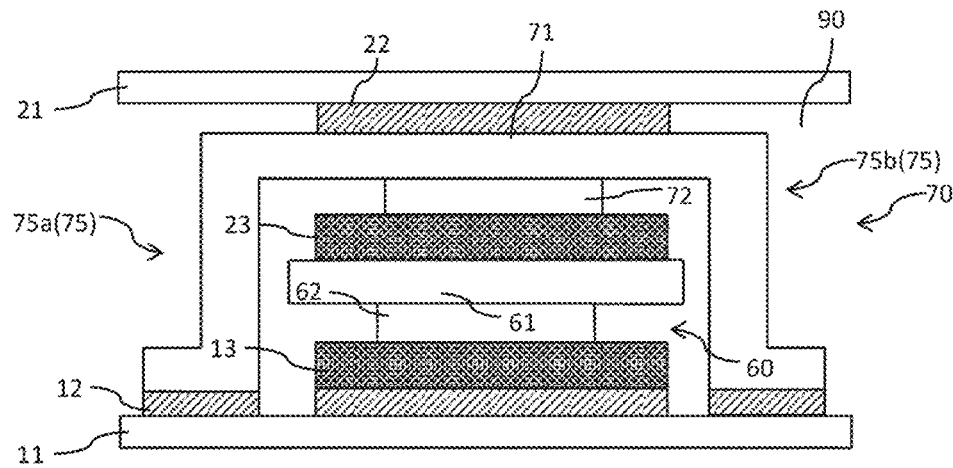
FIG. 13 is a longitudinal sectional view for illustrating a first connecting body and a second connecting body which may be used in a sixth embodiment of the present invention.

Each of the above embodiments has been described using the second connecting body 70 which has the second column part 72 and has a substantially T-shaped section. On the other hand, in the present embodiment, a second connecting body 70 has extending parts 75 (75a, 75b) each of which extends to the other side from a second head part 71 as illustrated in FIG. 13. Also in the present embodiment, all the aspects described in each of the above embodiments can be employed. The members already described in each of the above embodiments will be described using the same reference signs as those in the above embodiments.

The present embodiment is described using the aspect in which the two extending parts 75 are used. However, the present embodiment is not limited thereto, and one or three or more extending parts 75 may be used.

According to the present embodiment, since the extending part 75 is provided, it is possible to efficiently dissipate heat from a second electronic element 23 and achieve a high heat dissipation effect also by the second connecting body 70. Further, a plurality of extending parts 75 as described in the present embodiment is useful in that a higher heat dissipation effect can be achieved.

When the second connecting body 70 having a plurality of extending parts is employed as described in the present embodiment, a further larger repulsive force can be imparted against the warpage or distortion of the first substrate 11 and the second substrate 21 caused by heat. That is, although a force that causes the warpage or distortion of the first substrate 11 and the second substrate 21 is applied by the application of heat in the manufacturing process of the electronic module as described above, the use of the second connecting body 70 having a plurality of extending parts is useful in that it is possible to more reliably prevent the warpage or distortion of the first substrate 11 and the second substrate 21 also by the second connecting body 70 in addition to the action by the first coupling body 210.

Seventh Embodiment

Next, a seventh embodiment of the present invention will be described.

Each of the above embodiments has been described using the aspect in which the first connecting body 60 and the second connecting body 70 are used. However, the present embodiment is not limited to such an aspect. The first connecting body 60 and the second connecting body 70 may not be provided. For example, an aspect as illustrated in FIG. 1 in which the first connecting body 60 and the second connecting body 70 as illustrated in FIG. 2 are not provided may be employed. Also in the present embodiment, it is possible to obtain the effects described above relating to the first coupling body 210 and the second coupling body 220.

Eighth Embodiment

Next, an eighth embodiment of the present invention will be described.

Figure 14:
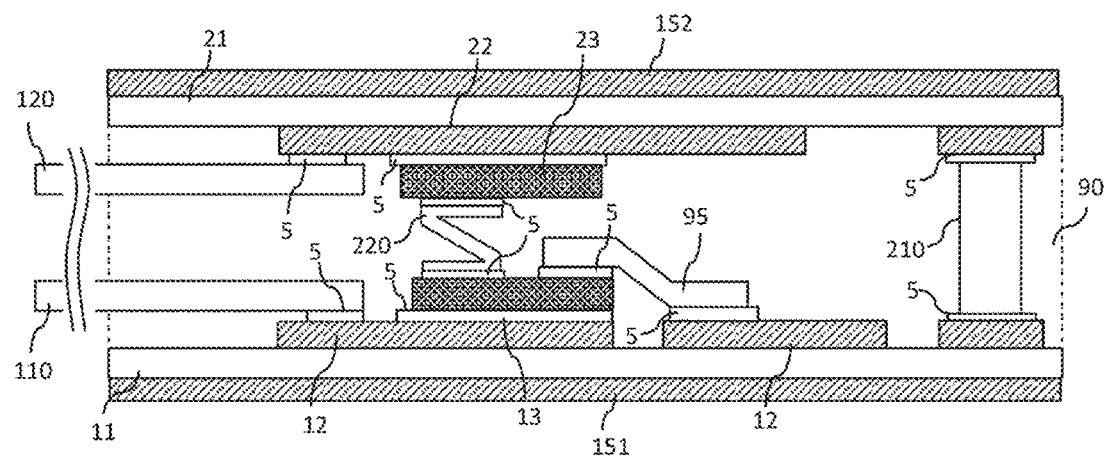
FIG. 14 is a longitudinal sectional view of an electronic module which may be used in an eighth embodiment of the present invention.
Figure 15:
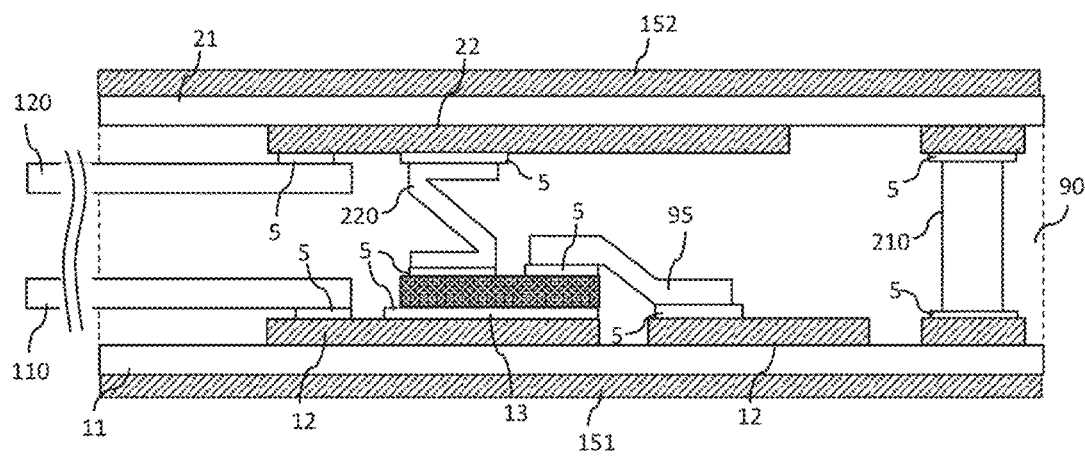
FIG. 15 is a longitudinal sectional view of an electronic module in another aspect which may be used in the eighth embodiment of the present invention.

The present embodiment employs an aspect in which at least one second coupling body 220 is disposed between electronic elements 13, 23 and second substrates 11, 21 or between the opposed electronic elements 13, 23. FIG. 14 illustrates an aspect in which the first electronic element 13 and the second electronic element 23 are provided. FIG. 15 illustrates an aspect in which the first electronic element 13 is provided. The other configuration is similar to the seventh embodiment. Also in the present embodiment, all the aspects described in each of the above embodiments can be employed. The members already described in each of the above embodiments will be described using the same reference signs as those in the above embodiments. FIG. 15 illustrates the aspect in which only the first electronic element 13 is provided. However, the present embodiment is not limited thereto, and an aspect in which only the second electronic element 23 is provided can also be employed.

As illustrated in FIG. 14, when the second coupling body 220 is disposed between the first electronic element 13 and the second electronic element 23, the first electronic element 13 and the second electronic element 23 can be electrically connected to each other by the second coupling body 220.

The aspect as illustrated in FIG. 15 may be employed. In this aspect, the second coupling body 220 is disposed between the first electronic element 13 and the second substrate 21 so that the first electronic element 13 and a second conductor layer 22 or the second substrate 21 which includes a metal substrate are electrically connected to each other by the second coupling body 220.

Similarly, there may be employed an aspect in which the second coupling body 220 is disposed between the second electronic element 23 and the first substrate 11 so that the second electronic element 23 and a first conductor layer 12 or the first substrate 11 which includes a metal substrate are electrically connected to each other by the second coupling body 220.

As described above, in the present embodiment, all the aspects described in each of the above embodiments can be employed. The aspect described above in which the second coupling body 220 has the elastic structure can also be employed (FIGS. 14 and 15 illustrate such an aspect having the elastic structure). The employment of the aspect in which the second coupling body 220 has the elastic structure in this manner is useful in that it is possible to prevent a strong pressing force from being applied to the electronic elements 13, 23.

Ninth Embodiment

Next, a ninth embodiment of the present invention will be described.

Figure 16:
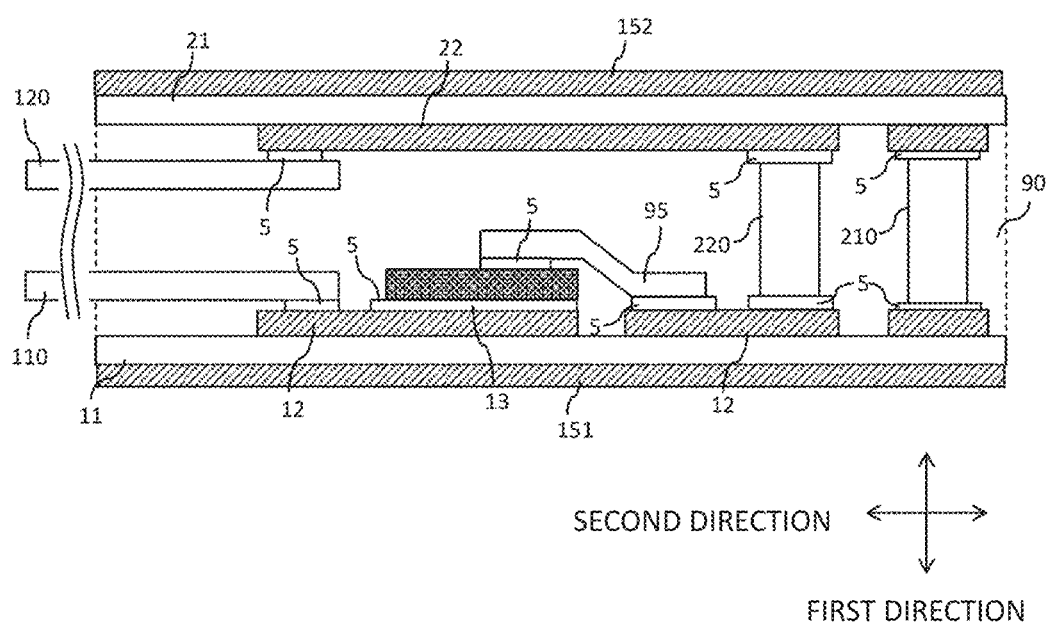
FIG. 16 is a longitudinal sectional view of an electronic module which may be used in a ninth embodiment of the present invention.

In the present embodiment, only either a first electronic element 13 or a second electronic element 23 is used. The other configuration is similar to the seventh embodiment. FIG. 16 illustrates an aspect in which only the first electronic element 13 is provided. However, the present embodiment is not limited thereto, and an aspect in which only the second electronic element 23 is provided can also be employed. Also in the present embodiment, all the aspects described in each of the above embodiments can be employed. Also in the present embodiment, it is possible to obtain the effects described above relating to the first coupling body 210 and the second coupling body 220.

The disclosure of the description and the drawings of each of the embodiments described above is a mere example for describing the invention described in the claims. The invention described in the claims is not limited by the disclosure of the description and the drawings of each of the embodiments described above. Further, the description of the original claims of the application is a mere example. The description of the claims can be appropriately changed on the basis of the description of the specification and the drawings.

REFERENCE SIGNS LIST 11 first substrate
12 first conductor layer
13 first electronic element (electronic element)
21 second substrate
22 second conductor layer
23 second electronic element (electronic element)
210 first coupling body
215 main body part
216 joining part
217 inclined part
220 second coupling body

The invention claimed is:
1. An electronic module comprising:
a first substrate;
an electronic element disposed on one side surface of the first substrate;
a second substrate facing the one side surface of the first substrate;
a pillar-shaped connecting member being disposed between the first substrate and the second substrate, and electrically connecting the electronic element and the second substrate;
a plurality of pillar-shaped coupling members being disposed between the first substrate and the second substrate, and coupling the first substrate and the second substrate; and
a sealing part sealing the electronic element, the connecting member and the plurality of the coupling members;
wherein each of the plurality of the coupling members is not electrically connected to the electronic element and has a length longer than the connecting member; and
wherein a thickness of conductive adhesive that bonds the plurality of pillar-shaped coupling members with the first substrate and the second substrate is smaller than a thickness of conductive adhesive that bonds the connecting member with the first substrate and the second substrate.

2. The electronic module according to claim 1, wherein the plurality of pillar-shaped coupling members are provided at positions near four corners of the first substrate having a rectangular shape and at positions near four corners of the second substrate having a rectangular shape.

3. The electronic module according to claim 1, wherein the connecting member has an elastic structure.

4. The electronic module according to claim 1, wherein each of the plurality of pillar-shaped coupling members has a main body part and a joining part having a smaller cross-sectional area than the main body part.

5. The electronic module according to claim 1, wherein each of the plurality of pillar-shaped coupling members has an inclined part whose cross-sectional area is continuously reduced.

* * * * *